United States Patent [19]
Marohl

[11] Patent Number: 5,964,561
[45] Date of Patent: *Oct. 12, 1999

[54] COMPACT APPARATUS AND METHOD FOR STORING AND LOADING SEMICONDUCTOR WAFER CARRIERS

[75] Inventor: Dan Marohl, San Jose, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/763,596

[22] Filed: Dec. 11, 1996

[51] Int. Cl.⁶ .................................................. B65G 1/04
[52] U.S. Cl. ..................... 414/217; 414/222; 414/277; 414/805; 414/806; 414/939; 414/940
[58] Field of Search ..................... 414/217, 416, 414/333, 786, 937, 939, 940, 222, 805, 806, 811, 281–283, 808, 276, 277, 609

[56] References Cited

U.S. PATENT DOCUMENTS

| | | | |
|---|---|---|---|
| 3,610,445 | 10/1971 | Kitchen et al. | 414/276 |
| 4,047,624 | 9/1977 | Dorenbos | 414/939 X |
| 4,615,430 | 10/1986 | Satoh | 414/237 X |
| 4,781,511 | 11/1988 | Harada et al. | 414/217 |
| 4,826,360 | 5/1989 | Iwasawa et al. | 414/940 X |
| 4,851,018 | 7/1989 | Lazzari et al. | 414/940 X |
| 4,904,153 | 2/1990 | Iwasawa et al. | 414/940 X |
| 4,986,715 | 1/1991 | Asakawa | 414/331 |
| 5,048,164 | 9/1991 | Harima | 414/940 X |
| 5,363,867 | 11/1994 | Kawaro et al. | 414/940 X |
| 5,391,035 | 2/1995 | Krueger | 414/217 |
| 5,399,531 | 3/1995 | Wu | 414/940 X |
| 5,425,611 | 6/1995 | Hughes et al. | 414/940 X |
| 5,462,397 | 10/1995 | Iwabuchi | 414/940 X |
| 5,464,313 | 11/1995 | Ohsawa | 414/940 X |
| 5,527,390 | 6/1996 | Ono et al. | 414/940 X |
| 5,562,383 | 10/1996 | Iwai et al. | 414/940 X |
| 5,570,990 | 11/1996 | Bonora et al. | 414/940 X |
| 5,586,585 | 12/1996 | Bonora et al. | 414/940 X |
| 5,628,604 | 5/1997 | Murata et al. | 414/940 X |
| 5,655,869 | 8/1997 | Scheler et al. | 414/940 X |
| 5,788,448 | 8/1998 | Wakamori et al. | 414/940 X |

FOREIGN PATENT DOCUMENTS

| | | | |
|---|---|---|---|
| 5-17006 | 1/1993 | Japan | 414/940 |
| 6-132186 | 5/1994 | Japan . | |

OTHER PUBLICATIONS

"Infab Universal Load Ports" 1995 Infab.

Primary Examiner—David A. Bucci
Attorney, Agent, or Firm—Valerie Dugan

[57] ABSTRACT

An improved apparatus and method is provided for storing semiconductor wafer carriers, and for loading wafers or wafer carriers to a fabrication tool. The apparatus comprises a plurality of storage locations positioned above the fabrication tool. The apparatus receives wafer carriers via a factory load port. The wafer carriers are transported between the factory load port and the storage locations via a first robot, and are transported between the fabrication tool load port and the storage locations via a second robot. Both robots access the respective load port from overhead, thus eliminating the need for a front loader robot, and reducing the apparatus' footprint. Each robot may access overhead factory transportation systems to provide further flexibility in wafer carrier transport. Additionally, the apparatus of the present invention may include a mechanism for opening pod type wafer carriers and for extracting wafers therefrom.

23 Claims, 12 Drawing Sheets

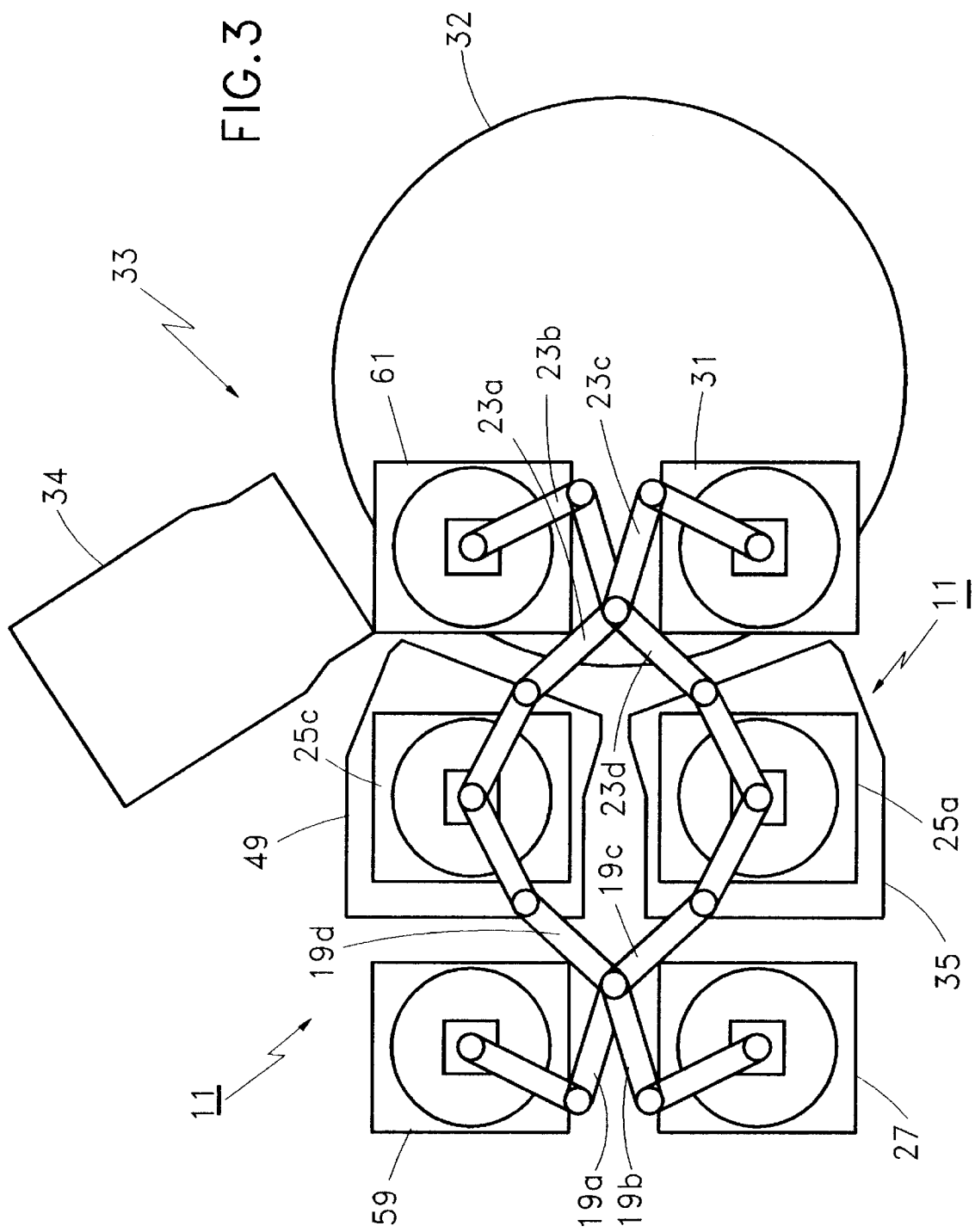

COMPACT APPARATUS AND METHOD FOR STORING AND LOADING SEMICONDUCTOR WAFER CARRIERS

CROSS REFERENCE TO RELATED APPLICATIONS

The present application is related to commonly owned application Ser. No. 08/764,661 filed on even date herewith, entitled "FACTORY AUTOMATION APPARATUS AND METHOD FOR HANDLING, MOVING AND STORING SEMICONDUCTOR WAFER CARRIERS" by Robert Z. Bachrach, the summary, drawings and description thereof are incorporated herein by reference.

FIELD OF THE INVENTION

The present invention relates generally to semiconductor wafer fabrication systems, and to an improved method and apparatus for storing and loading semiconductor wafer carriers at a given semiconductor wafer fabrication tool.

BACKGROUND

The drive for reduced cost per unit wafer processed characterizes the semiconductor industry. Thus the semiconductor industry continuously searches for ways to increase wafer output and/or reduce overall equipment costs (costs of ownership). Among the factors significantly affecting cost of ownership for a given piece of equipment are clean room costs, footprint and labor costs. It is well recognized that overall semiconductor wafer fabrication system (i.e., fabrication tool) productivity increases are achieved by ensuring a constant supply of wafers at each tool. Conventionally this has been accomplished by employing a local buffer supply (i.e., a supply of wafers at the tool). For example, the "MINI BUFFER" marketed by Jenoptik/Infab is a vertical buffer which is positioned near a fabrication tool's load lock chambers. The MINI BUFFER comprises a series of vertically arranged shelves and one or more load ports for access by the tool's loader robot, and/or for access by factory transport agents (i.e., the mechanism that transfers wafer carriers from the factory to the buffer apparatus' factory load port). Conventionally one MINI BUFFER is positioned near each load lock, a distance from the load lock sufficient to accommodate the axis of rotation of a front loader robot. The loader robot may then access either MINI BUFFER to obtain a wafer carrier for loading to either load lock. Although such methods maintain a constant local buffer supply of wafer carriers, they occupy a considerable amount of floor space thus increasing the system's cost of ownership. The fact that fabrication tools are frequently maintained in a clean room environment further exacerbates the increased cost associated with the system's larger footprint.

In addition, most prior art systems do not allow simultaneous access by the tool loader and the factory transport agent, and thereby complicate factory transport scheduling.

A related, commonly-assigned application Ser. No. 08/764,661 discloses a Factory Automation Apparatus and Method for Handling, Moving and Storing Semiconductor Wafer Carriers. Application Ser. No. 08/764,661 provides an apparatus which advantageously allows for independent operation of the factory transport agent and the fabrication tool's loader mechanism, and provides for local interconnection of fabrication tools in a reduced footprint configuration. However, a continuous need exists for an apparatus and method which provides even further footprint reduction.

SUMMARY OF THE PREFERED EMBODIMENTS

The present invention provides a compact method and apparatus for buffering wafer carriers to be loaded to a fabrication tool (i.e., a load buffer) which eliminates the need for the front loader robot required of prior art systems and provides overhead storage locations, therefore greatly reducing footprint as compared to prior art systems. The load buffer features 1) two physically separate load ports; a load port for transferring wafer carriers between the factory and the load buffer apparatus, and a wafer exchange port for transferring either the entire wafer carrier, or one or more wafers at a time between the load buffer apparatus and the fabrication tool and; 2) overhead storage locations. Preferably the load buffer will have two pairs of physically separated load ports comprising a first load port and a first wafer exchange port, and a second load port and a second wafer exchange port respectively. In a further aspect the load buffer includes top opening load locks to receive wafers for loading into the fabrication tool. Each load lock includes a loader mechanisms for transferring wafers or cassettes of wafers between the wafer exchange port and the load lock chamber. The physical separation of the load port and the wafer exchange port allows for independent loading of both the load buffer apparatus and the fabrication tool. The independent loading of the load buffer apparatus and the fabrication tool allows a factory transport agent to operate independent of the operation of the fabrication tool's loader mechanism, making factory-wide automation more flexible and efficient.

The overhead storage locations are above the fabrication tool (as used herein a first feature described as "above" a second feature shall mean the first and second feature have at least partially overlapping footprints). Preferably the overhead storage locations are substantially above the fabrication tool (i.e., the footprint of the overhead storage locations substantially overlap the footprint of the fabrication tool), and most preferably the overhead storage locations are completely above the fabrication tool (i.e., the footprint of the overhead storage locations completely overlap the footprint of the fabrication tool). The combination of overhead storage and top opening load locks allows for significant reduction in the footprint of the automated local area semiconductor wafer fabrication system (i.e., the combined fabrication tool and load buffer). The overhead storage and top opening load locks provide the fabrication tool with a constant buffer supply of wafer carriers in a significantly reduced footprint configuration.

In one aspect the inventive load buffer apparatus comprises: a first load port, a first vertical transfer mechanism for elevating wafer carriers to a height greater than that of the fabrication tool; at least one storage location located above the fabrication tool operatively coupling the first vertical transfer mechanism; a second vertical transfer mechanism, operatively coupling the at least one storage location, for lowering the wafer carrier; and a first wafer exchange port, operatively coupling the second vertical transfer mechanism. As used herein the phrase "operatively coupling" means configured such that a wafer carrier can be transferred between the identified components.

In a preferred embodiment the at least one storage location comprises one or more shelves which are operatively coupled to both the first and second vertical transfer mechanisms, i.e., the shelves are located such that wafer carriers can be passed from the first vertical transfer mechanism to the second vertical transfer mechanism via the series of shelves. Preferably the first and second vertical transfer mechanisms comprise a first and second robot each having both a y-axis component and an x-axis component; the x-axis component being movably coupled to the y-axis component such that the x-axis component can travel along the length of the y-axis component. The first robot is configured so as to access the first load port and the second load port from a first and second position above the first and second load port respectively; and the second robot is configured so as to access the first wafer exchange port and the second wafer exchange port from a third and fourth position above the first and second wafer exchange port respectively. Preferably the first, second, third and fourth positions are substantially above, and most preferably completely above the respective port.

In another aspect, the inventive load buffer further comprises a top opening load lock such as that disclosed in U.S. Pat. No. 5,391,035 entitled "Micro-Environmental Load Lock" the entirety of which is hereby incorporated by reference. In one aspect the top opening load lock has a first lid comprising a wafer carrier engaging mechanism which engages a second lid (the lid of a pod type wafer carrier positioned on the first wafer exchange port) such that elevation of the first lid causes the second lid to elevate, opening the wafer carrier positioned on the first wafer exchange port. In a further aspect the wafer exchange port is positioned above the fabrication tool's transfer chamber and wafers are extracted therefrom and transferred to a position within the open first load lock by a loader first loader mechanism such as the wafer extraction platform disclosed in commonly owned U.S. application Ser. No. 08/764,661 entitled "Magnetically Coupled Wafer Extraction Platform" by Dan Marohl, the entire summary, drawings and description thereof are incorporated herein by reference.

Other objects, features and advantages of the present invention will become more fully apparent from the following detailed description of the preferred embodiments, the appended claims and the accompanying drawings.

BREIF DESCRIPTION OF THE DRAWINGS

FIG. 3 is a top plan view of the load buffer of FIG. 2 which shows a preferred footprint thereof;

FIGS. 5A–5C are side elevational views of the load buffer of FIG. 2, which are useful in explaining a second aspect of wafer carrier transport there through.

DETAILED DESCRIPTION OF THE DRAWINGS

Figure 1:
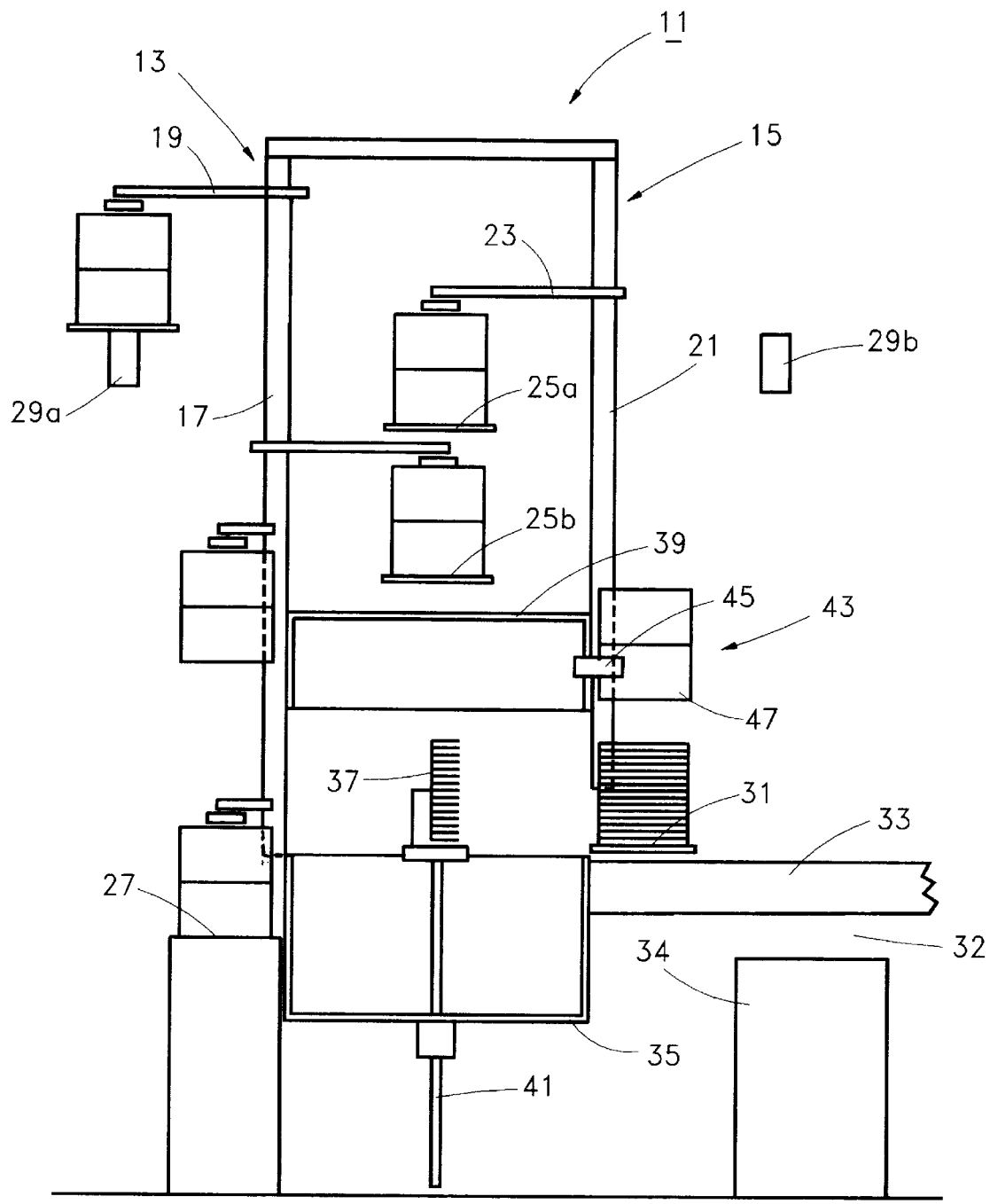
FIG. 1 is a side view of an inventive load buffer.

FIG. 1 is a side view of an inventive load buffer 11. The load buffer 11 comprises a first and second vertical transfer mechanism comprised of a first robot 13 and a second robot 15, respectively. The first robot 13 comprises a first y-axis component 17 and a first x-axis component 19 movably coupled to the first y-axis component 17 such that the first x-axis component 19 may travel along the length of the first y-axis component 17. Similarly, the second robot 15 comprises a second y-axis component 21 and a second x-axis component 23 movably coupled to the second y-axis component 21 such that the second x-axis component 23 may travel along the length of the second y-axis component 21. Operatively coupled between the first robot 13 and the second robot 15 are one or more storage locations 25a, 25b. The first robot 13 is configured such that when the first x-axis component 19 is at the lower portion of the first y-axis component 17 it may access a first load port 27 (preferably a SEMI E15 type load port) and such that when the first x-axis component 19 is at the upper portion of the first y-axis component 17 it may access a first overhead load port (not shown) which provides access to a first overhead wafer carrier transport system such as a monorail, referenced generally by the numeral 29a of FIG. 1. The second robot 15 is configured such that when the second x-axis component 23 is at the lower portion of the second y-axis component 21 it may access a first wafer exchange port 31 and, optionally, such that when the second x-axis component 23 is at the upper portion of the second y-axis component 23 it may access an optional second overhead load port which provides access to a second overhead wafer carrier transport system such as a monorail, referenced generally by the numeral 29b in FIG. 1. Both the first x-axis component 19 and the second x-axis component 23 are configured so as to reach any of the storage locations 25a, 25b. In a preferred embodiment, each load port, each overhead load port and each wafer exchange port may simply comprise a predetermined location.

The first wafer exchange port 31 is preferably located substantially or completely above a fabrication tool 33 having at least a transfer chamber 32, a process chamber 34 and a first load lock 35. Most preferably the first wafer exchange port 31 is located above the transfer chamber 32 of the fabrication tool 33. The first wafer exchange port 31 is operatively coupled to the first load lock 35 via a first loader mechanism referenced generally by the numeral 37 of FIG. 1. The first loader mechanism 37 comprises a wafer cassette platform such as that described in co-pending U.S. application Ser. No. 08/763,604 that extends outside the open load lock 35 to extract wafers from a cassette located on the first wafer exchange port 31. The first load lock 35 has a first lid 39 and a lift-lower mechanism 41. In the present invention the first loader mechanism 37 is positioned on lift-lower mechanism 41. When the first lid 39 and the lift-lower mechanism 41 are in their elevated positions, as shown in FIG. 1, the first loader mechanism 37 extends horizontally, extracts one or more wafers from a first wafer carrier 43 (or, alternatively, can transfer the entire wafer carrier) located on the first wafer exchange port 31 and retracts carrying the extracted wafers (or the entire cassette) into position on the lift-lower mechanism 41. The lift-lower mechanism 41 then lowers the wafers (or the cassette) as the first lid 39 lowers.

Further, in a preferred embodiment the first lid 39 has a wafer carrier-engaging mechanism referenced generally by the numeral 45 of FIG. 1 which will engage a second lid 47 of a first wafer carrier 43 located on the first wafer exchange port 31 causing the second lid 47 to elevate as the first lid 39 elevates. Thus, as shown in FIG. 1, the first wafer carrier 43 is open and ready for the first loader mechanism 37 to extract wafers for loading to the first load lock 35.

Figure 2:
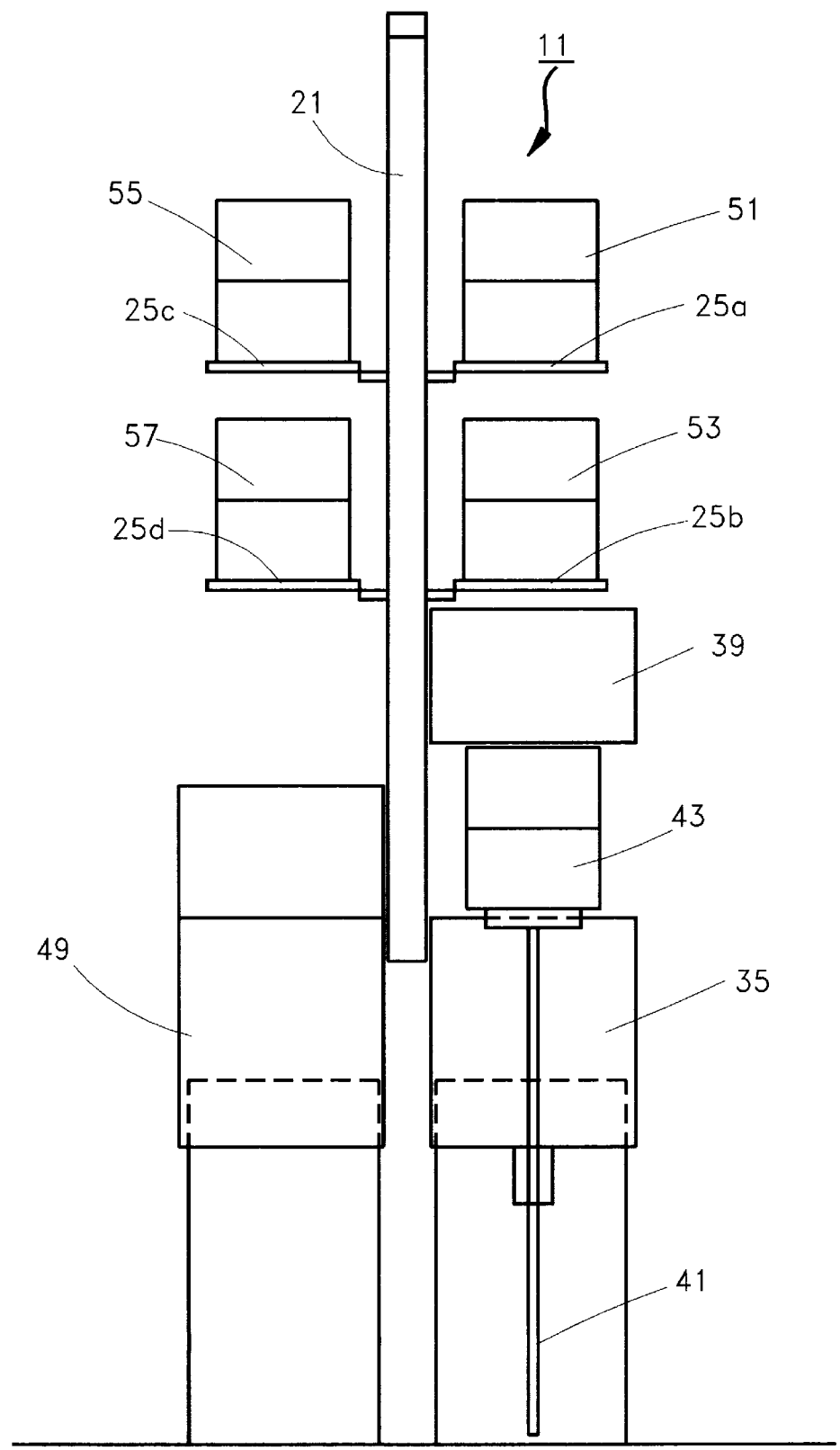
FIG. 2 is a front elevational view of the load buffer of FIG. 1 which shows a preferred arrangement of four storage locations 25a, 25b, 25c, and 25d.

FIG. 2 is a front elevational view of the load buffer 11 of FIG. 1 which shows a preferred arrangement of four storage locations 25a, 25b, 25c, and 25d, above the first load lock 35 and a second load lock 49. As shown in FIG. 2, the first load lock 35 is open with the first lid 39 elevated and the first wafer carrier 43 loaded on the lift-lower mechanism 41 for subsequent lowering into the first load lock 35. A second wafer carrier 51, a third wafer carrier 53, a fourth wafer carrier 55 and a fifth wafer carrier 57 are in storage on the storage locations 25a, 25b, 25c and 25d, respectively.

FIG. 3 is a top plan view of the load buffer 11 of FIGS. 1 and 2 which shows a preferred footprint of the load buffer 11, and which shows in pertinent part, a preferred footprint of the local area semiconductor wafer fabrication system. The four primary horizontal positions of the first x-axis component 19 and of the second x-axis component 23 are represented as 19a, 19b, 19c, and 19d, and 23a, 23b, 23c, and 23d respectively. However, it is understood that the first x-axis component 19 and the second x-axis component 23 each occupy only one of these positions at a given time. (The primary vertical positions of the first x-axis component 19 and of the second x-axis component 23 are shown sequentially in FIGS. 4A–4F and FIGS. 5A–5C.) As shown, the first load port 27 and a second load port 59 are advantageously positioned directly adjacent the first load lock 35 and the second load lock 49 of the fabrication tool 33, resulting in the overall footprint of the local area semiconductor wafer fabrication system being considerably smaller than that of prior art systems which require sufficient space for a front loader robot. Such advantageous positioning of the first load port 27 and the second load port 59 is possible because wafer carriers entering the load buffer 11 via the first load port 27 or the second load port 59 are extracted from the top of the first load port 27 and the second load port 59, respectively, rather than from the sides thereof. Similarly, because the first load port 27 and the second load port 59 are loaded and unloaded from above, they may be positioned in close proximity to each other, unlike side loaded prior art systems whose load ports must be positioned a sufficient distance from each other to accommodate the loader robot's axis of rotation.

Further, as shown by FIG. 3, storage locations 25a and 25c are positioned above the first load lock 35 and the second load lock 49, respectively, and the first wafer exchange port 31 and a second wafer exchange port 61 are positioned above the transfer chamber 32 of the fabrication tool 33. The location of the plurality of storage locations 25a–25d, the first wafer exchange port 31 and the second wafer exchange port 61 above the fabrication tool allows the footprint of the inventive local area semiconductor wafer fabrication system to be significantly smaller than that of prior art systems. The smaller footprint provided by the present invention reduces the systems cost of ownership which in turn reduces the cost of each unit produced.

FIGS. 4A–4F are side elevational views of the load buffer 11, which are useful in explaining a first aspect of wafer carrier transport through the load buffer 11. The components of the load buffer 11 are described above with reference to FIG. 1 and are therefore not repeated here. Further, in the preferred embodiment, the entire load buffer apparatus 11 is maintained under a vacuum hood. However, it is understood that if the load buffer 11 were not under vacuum, the steps of opening a pod type wafer carrier and loading the wafers to the load lock would be performed within an enclosed vacuum chamber that would surround each wafer exchange port and the open load lock associated therewith.

Figure 4A:
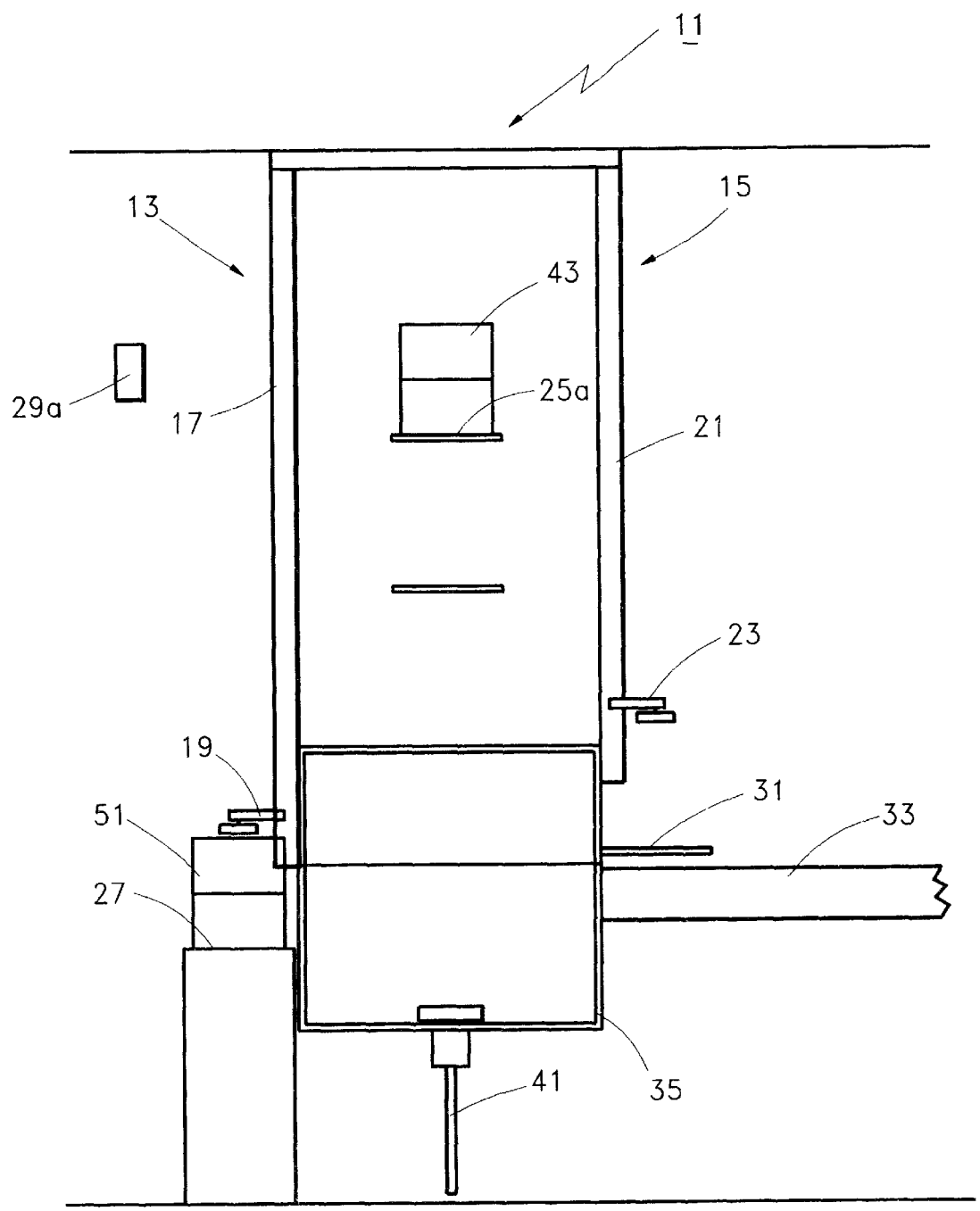
FIGS. 4A–4F are side elevational views of the load buffer of FIG. 2, which are useful in explaining a first aspect of wafer carrier transport therethrough.

As shown in FIG. 4A the first wafer carrier 43 is in storage at the storage location 25a. In operation, a second wafer carrier 51 is placed on the first load port 27 by, for example, an operator, automatic guided vehicle (AGV) or rail-guided vehicle (RGV), and the first x-axis component 19 of the first robot 13 lowers to pick up the second wafer carrier 51, as shown in FIG. 4A. The second robot 15 operates independently of the first robot 13, and may therefore be in any required position at a given time.

Figure 4B:
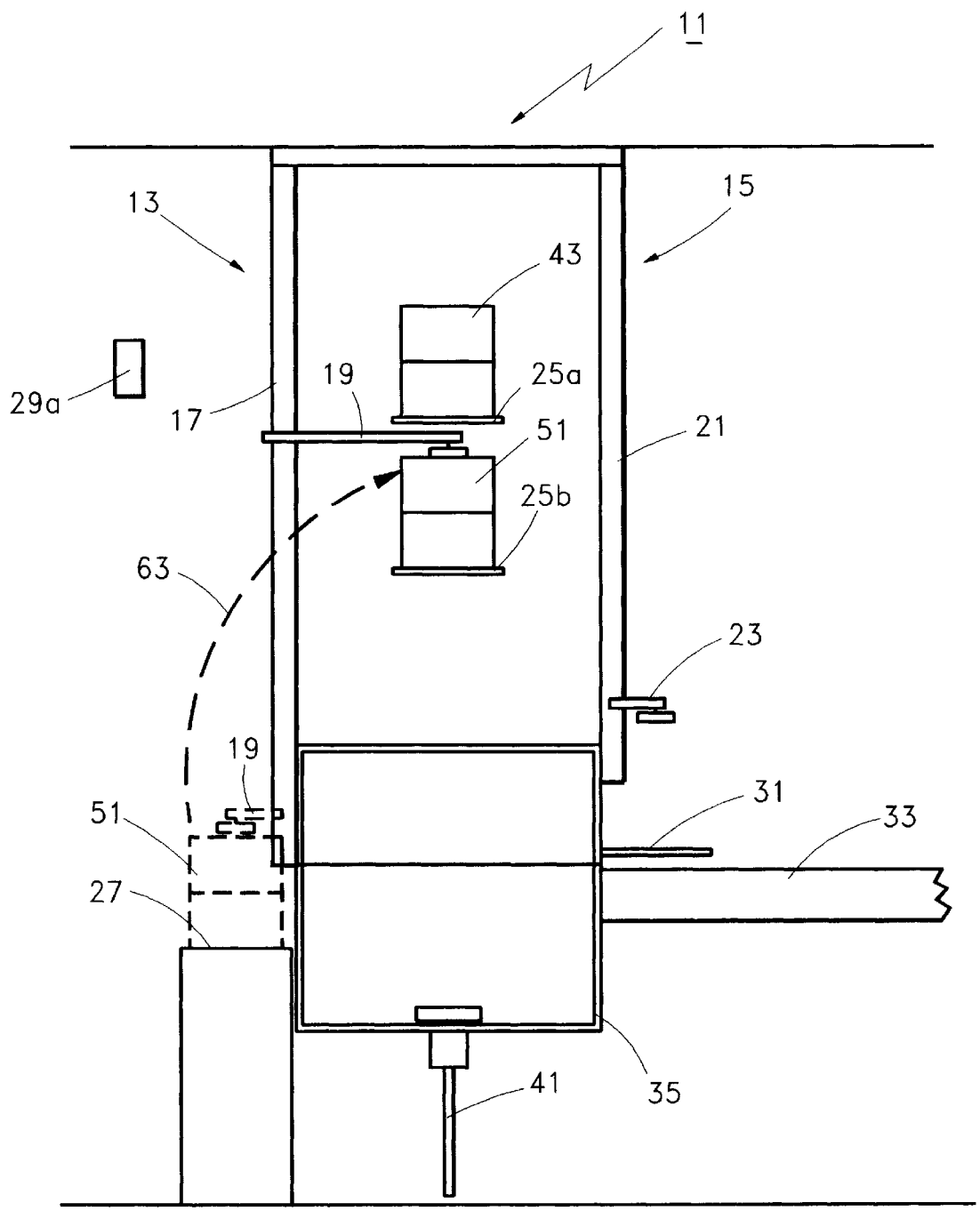

Next, as shown in FIG. 4B, the first x-axis component 19 lifts the second wafer carrier 51 and pivots to deposit the second wafer carrier 51 on the storage location 25b, as represented by arrow 63.

Figure 4C:
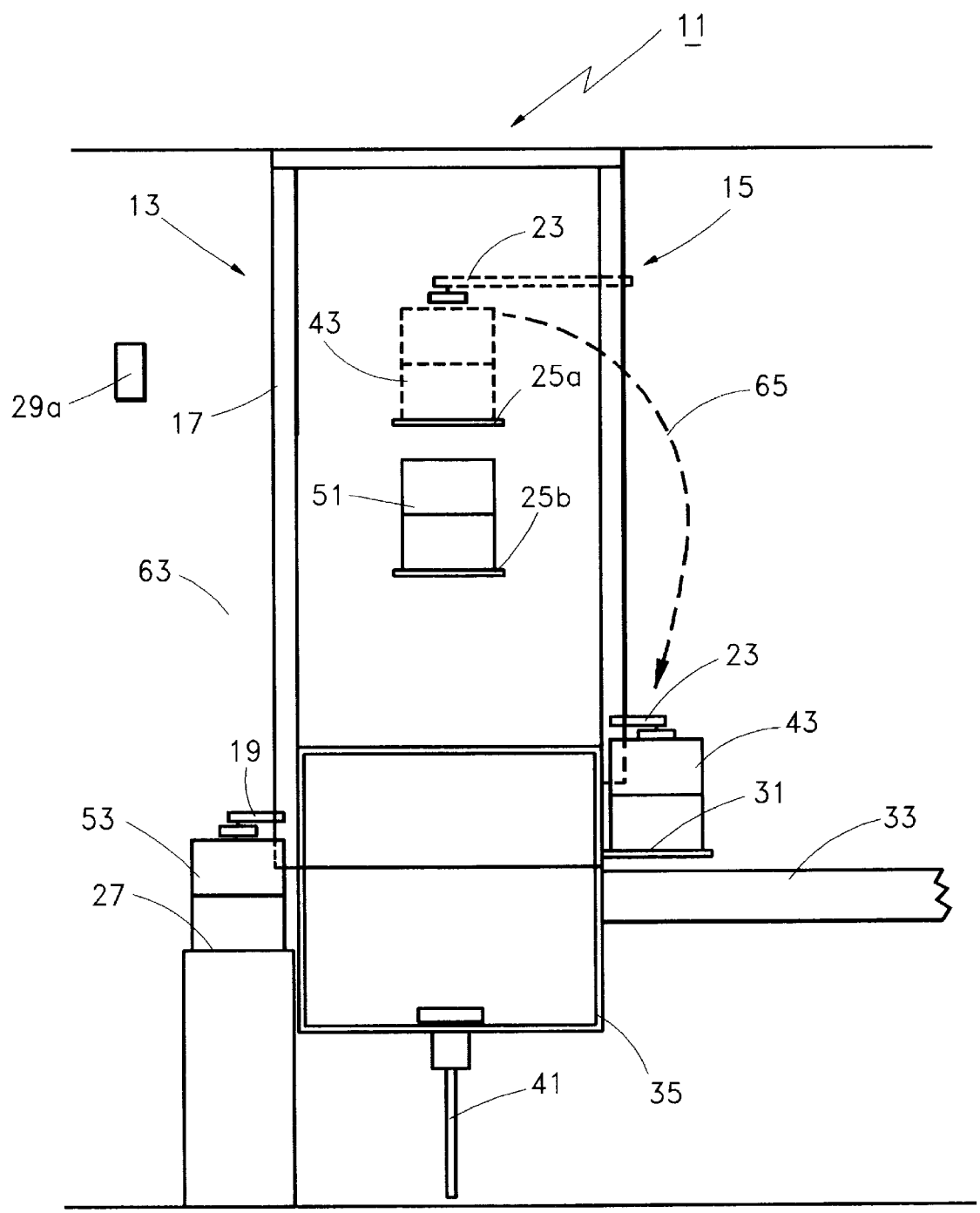

Thereafter, as shown in the example of FIG. 4C, the first x-axis component 19 may pivot and lower to pick up the third wafer carrier 53 from the first load port 27, as the second x-axis component 23 of the second robot 15 picks up the first wafer carrier 43 from the storage location 25a, pivots, lowers and deposits the first wafer carrier 43 at the first wafer exchange port 31, as represented by the arrow 65.

Figure 4D:
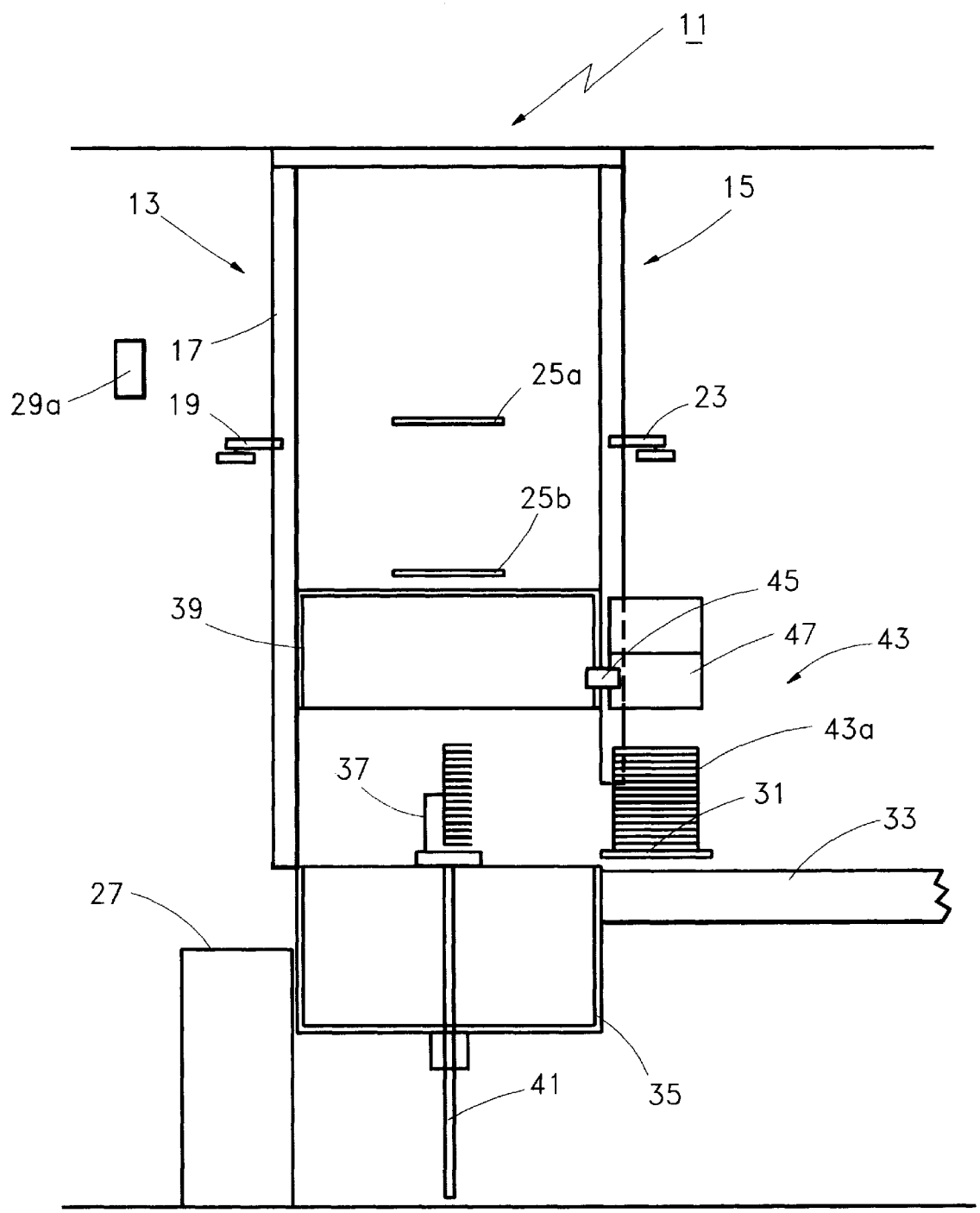

As shown in FIG. 4D the first lid 39 of the first load lock 35 elevates, and the wafer carrier-engaging mechanism 45, which engages the second lid 47, of the first wafer carrier 43, causes the second lid 47 to elevate. Thus, the first wafer carrier 43 is open and any number of wafers or the entire cassette 43a (i.e., the contents of the open pod type first wafer carrier 43) may be transferred from the first wafer exchange port 31 to the open first load lock 35. As described with reference to FIG. 1, the first loader mechanism 37 may be a conventional apparatus, or, preferably, is as described in application Ser. No. 08/763,604. The apparatus described in Ser. No. 08/763,604 comprises a slotted assembly which extends to position the slots beneath the wafers to be extracted. The assembly then elevates, lifting the wafers, and retracts. The assembly can be modified such that the number of slots correspond to the number of wafers to be extracted, or can be modified to extend to a position beneath the entire cassette, thus transporting the entire cassette when the assembly retracts.

Figure 4E:
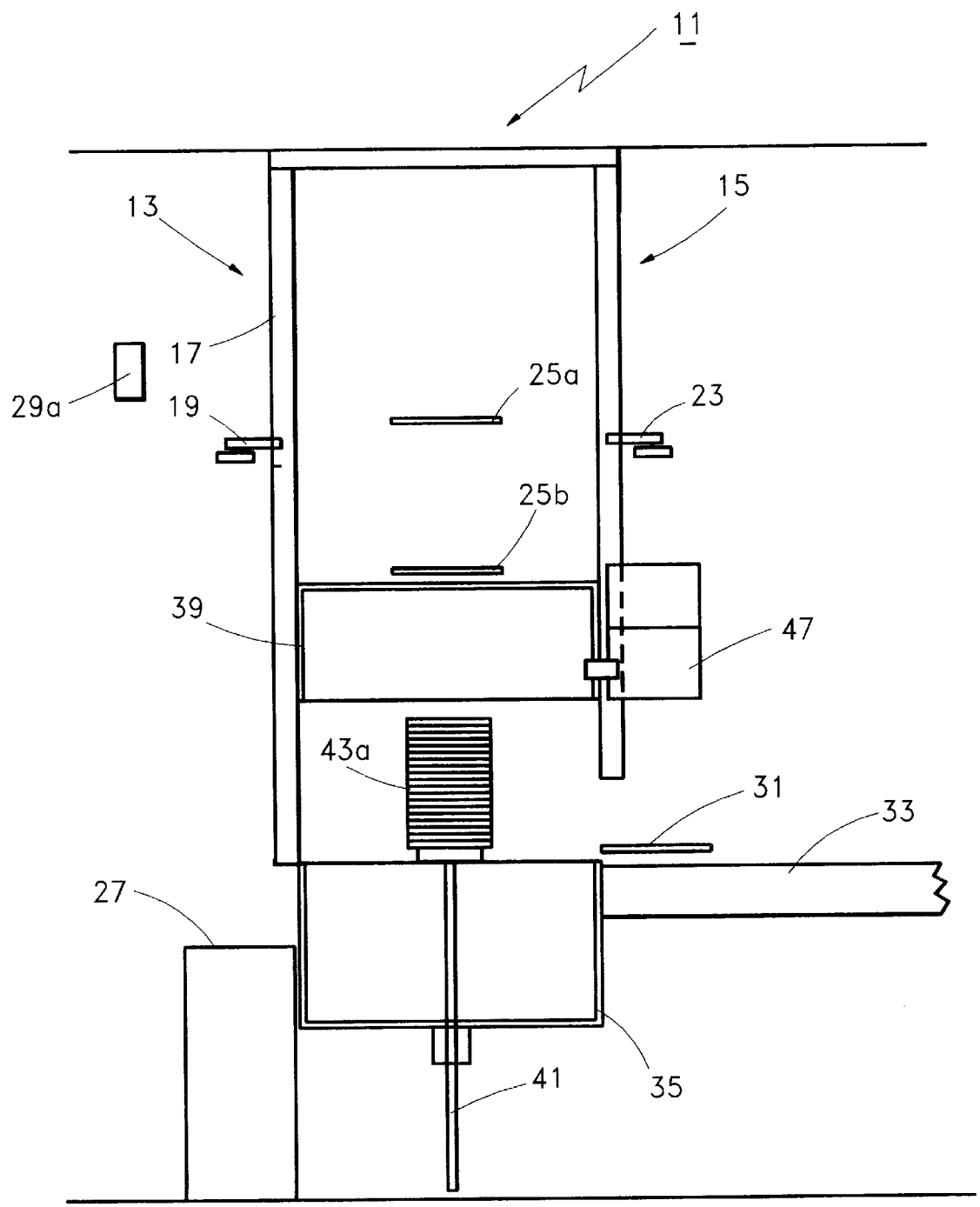

FIG. 4E shows the wafer cassette 43a (extracted from the open first wafer carrier 43) positioned on the lift-lower mechanism 41 for subsequent lowering into the first load lock 35.

Figure 4F:
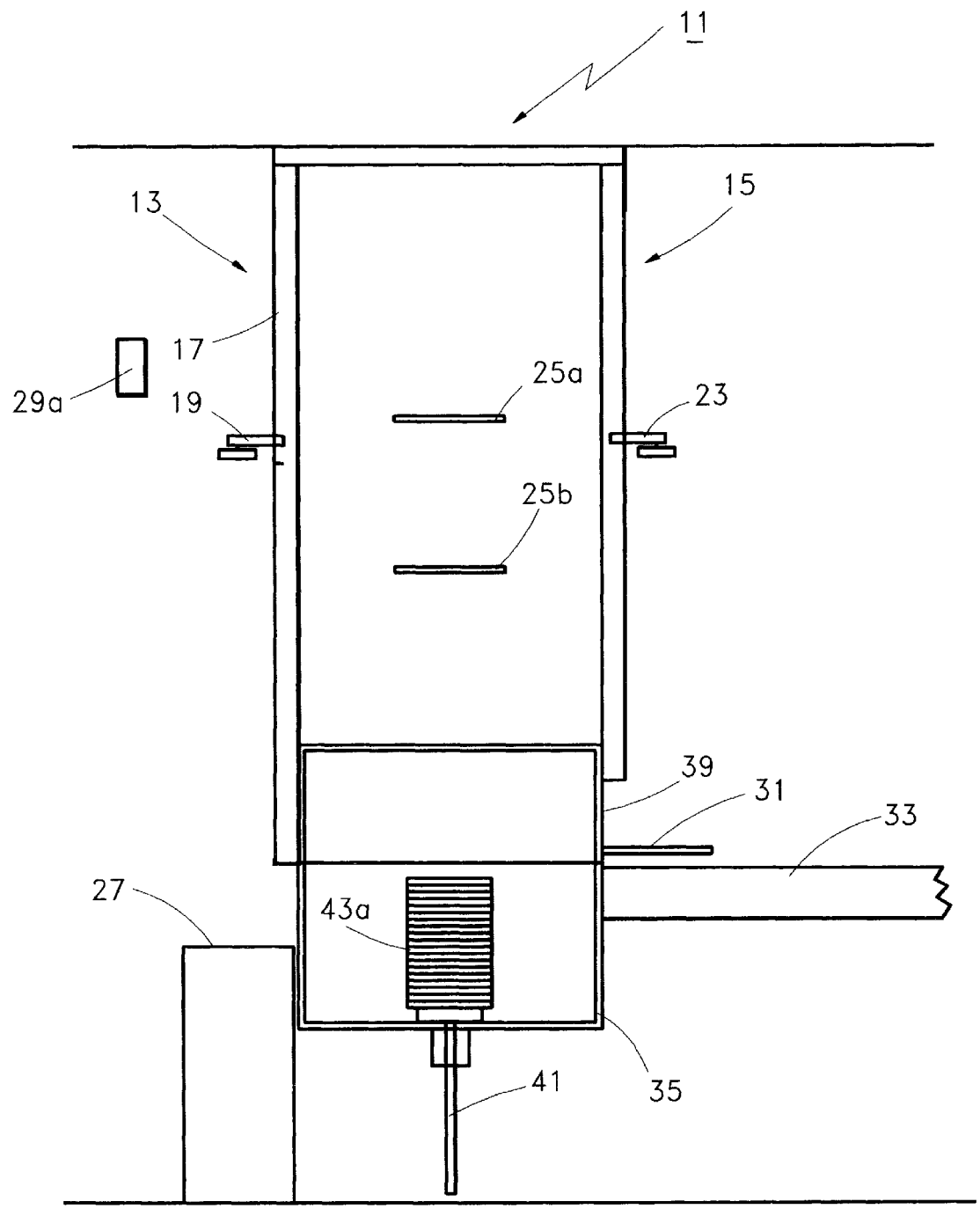

FIG. 4F shows the wafer cassette 43a positioned within the first load lock 35, and the first lid 39 of the first load lock 35 in the closed position. Thereafter wafers may be extracted from the first load lock 35 and processed within the fabrication tool 33. The empty first wafer carrier 43 can be closed and moved to one of the storage locations 25a–25d or can remain positioned on first wafer exchange port 31 until wafers have been processed and returned to the first wafer carrier 43.

The first robot 13 and the second robot 15 may continue to operate independent of the loading of the first wafer carrier 43 from the first wafer exchange port 31 to the first load lock 35. Although not shown in FIGS. 4E and 4F, the first robot 13 may continue transferring wafer carriers between the first load port 27 and/or the overhead load port (e.g., a predetermined location along the monorail 29) and the plurality of storage locations 25a–25d; and the second robot 15 is able to pick up wafer carriers as required from the plurality of storage locations 25a–25d, and deposit them at either the first wafer exchange port 31 or the second wafer exchange port 61, provided the particular wafer exchange port is vacant.

The configuration of the load buffer 11 advantageously enables independent operation of the first robot 13 and the second robot 15, and enables independent loading and unloading of each pair of load ports (e.g., the first load port and the first wafer exchange port) and the overhead load ports. Thus, it is understood that the specific operation of the load buffer 11 described with reference to FIGS. 4A–4F is merely exemplary.

Figure 5A:
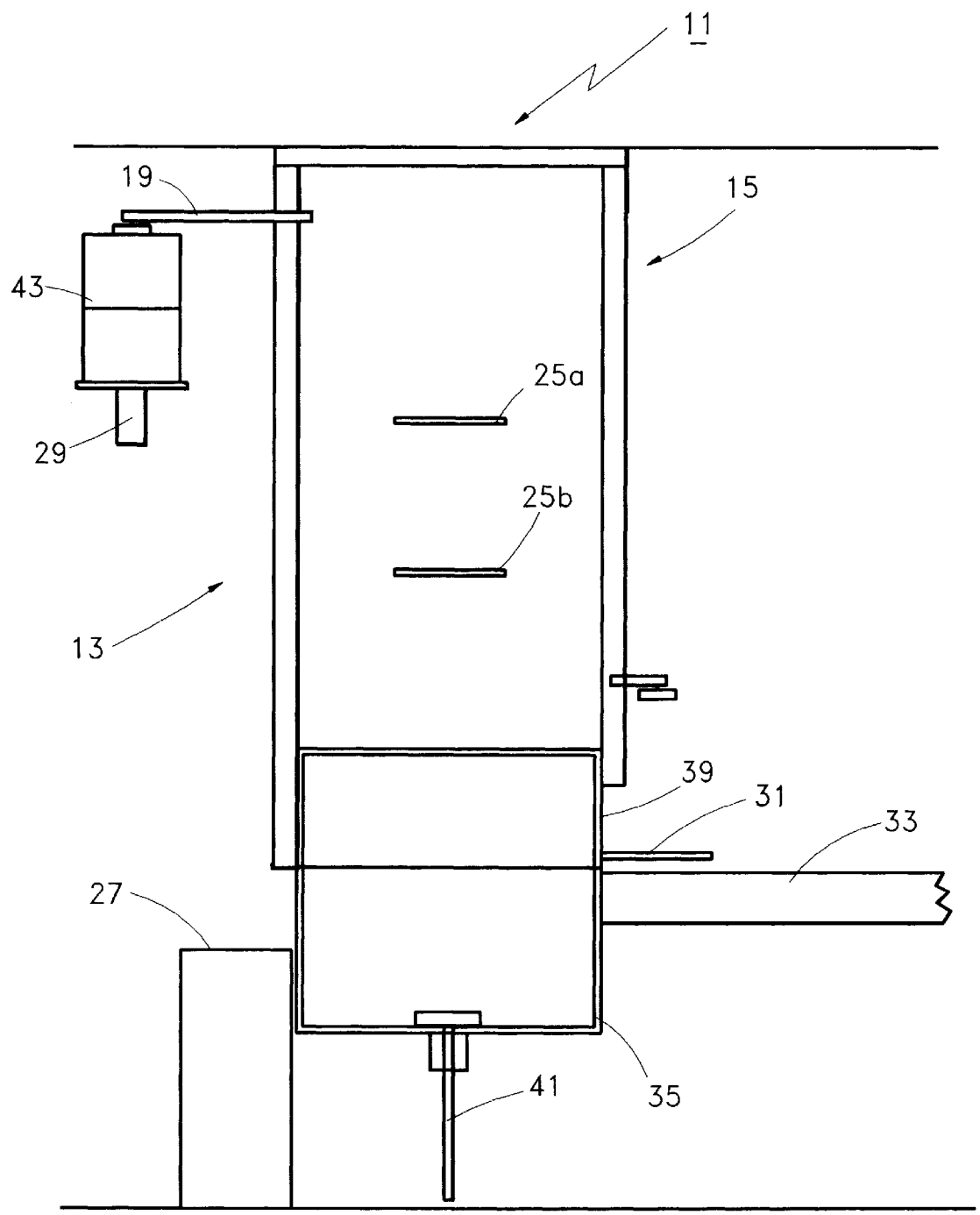
Figure 5B:
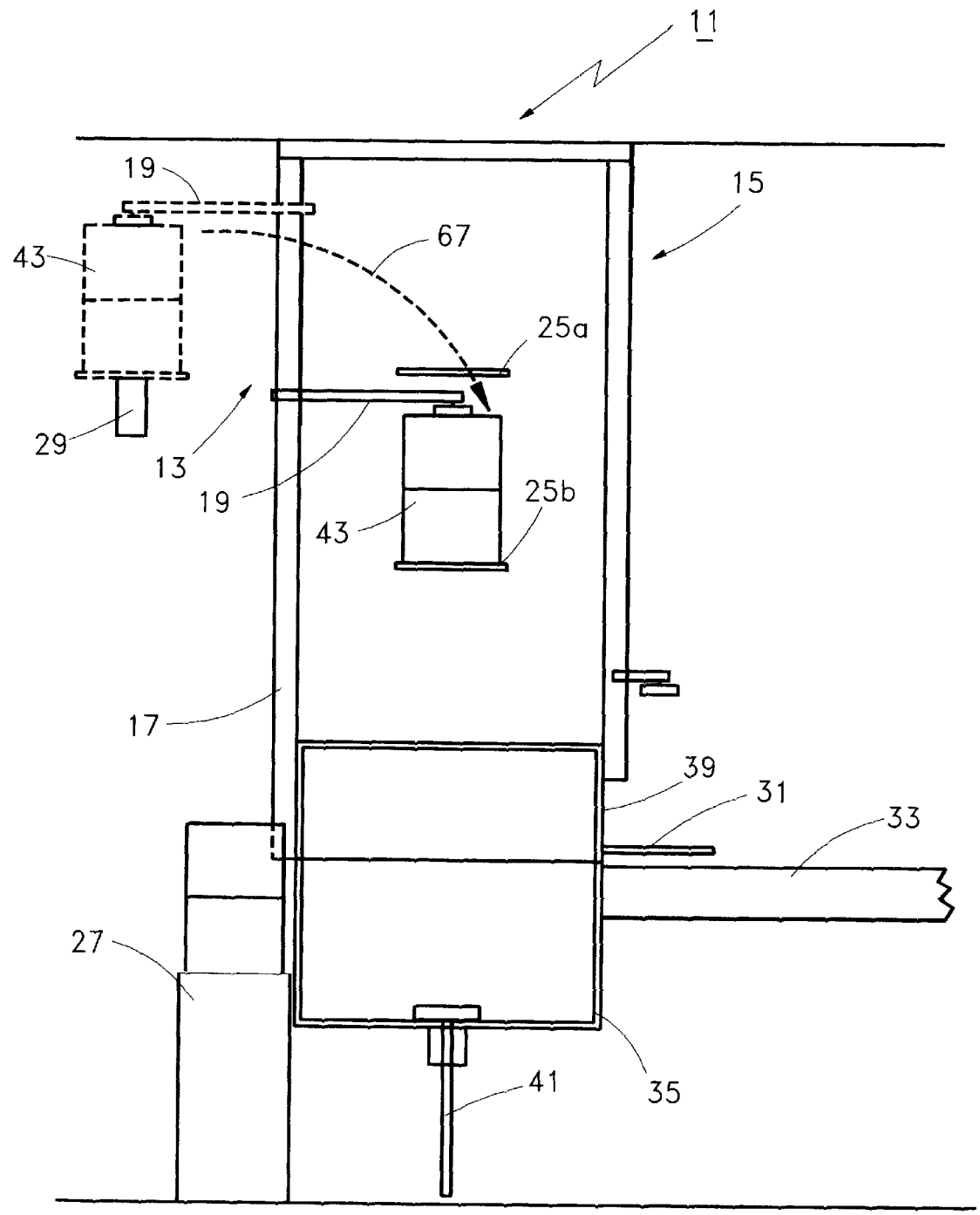
Figure 5C:
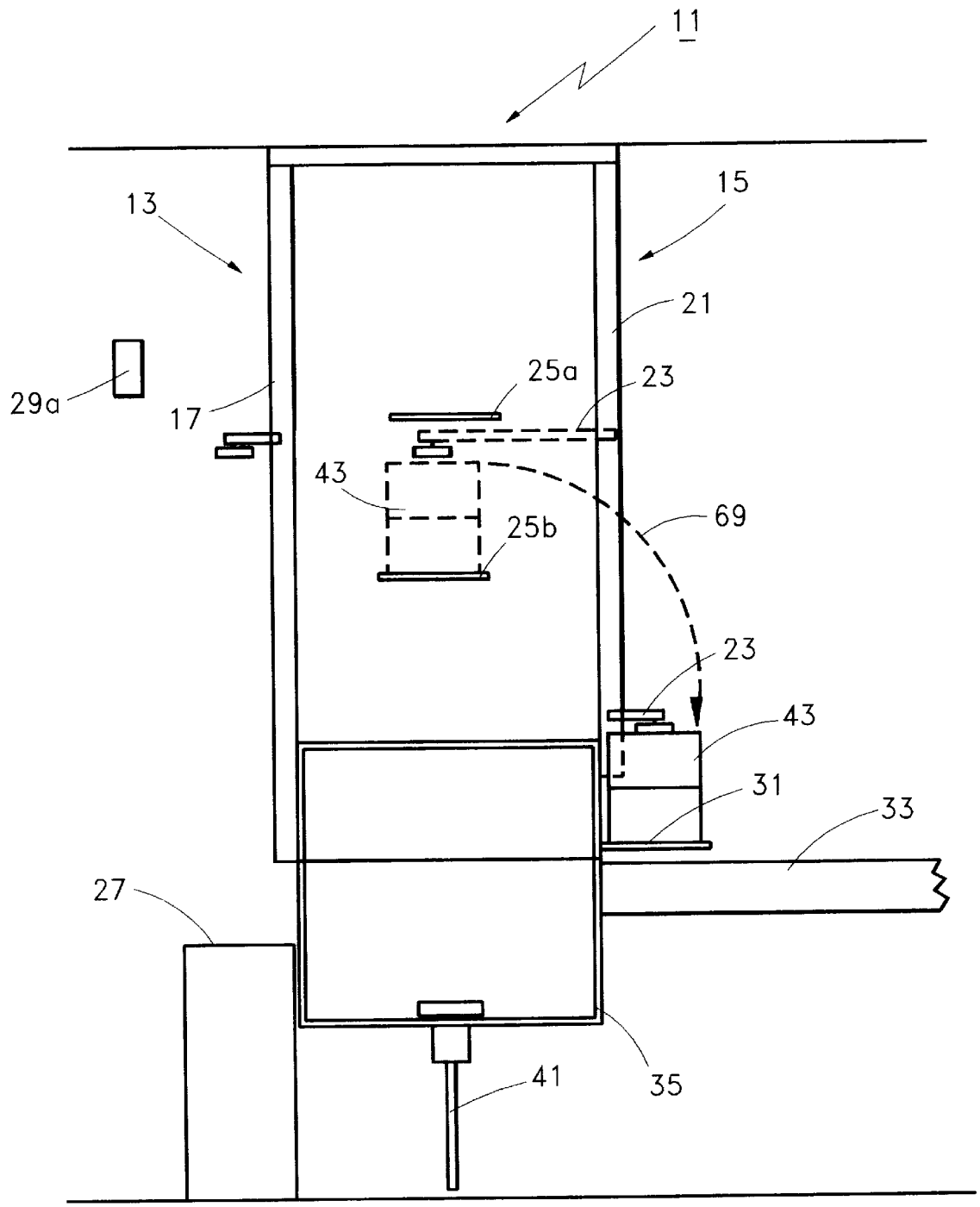

FIGS. 5A–5C are side elevational views of the load buffer of FIG. 2, which are useful in explaining a second aspect of wafer carrier transport therethrough. As shown in FIG. 5A the first x-axis component 19 of the first robot 13 pivots to pickup the first wafer carrier 43 from the monorail 29. Thereafter as shown in FIG. 5B, the first x-axis component 19 lowers and pivots about the first y-axis component 17 to deposit the first wafer carrier 43 on the storage location 25b, as represented by the arrow 67. Then, as shown in FIG. 5C, the second x-axis component 23 of the second robot 15 picks up the first wafer carrier 43 from the storage location 25b and pivots about the second y-axis component 21 and lowers to deposit the first wafer carrier 43 on the first wafer exchange port 31, as represented by arrow 69. Thereafter the first wafer carrier 43 is opened and lowered into the first load lock 35 as previously described with reference to FIGS. 4D–4F. While only the first wafer carrier 43 is shown traveling through the load buffer 11, it is understood that when the first x-axis component 19 and the second x-axis component 23 are not transporting the first wafer carrier 43, they may be picking up, transporting, or depositing other wafer carriers at any location within load buffer 11, as previously described. In sum, the operation of the first robot 13 and the second robot 15 may be synchronous at certain times, and also may operate asynchronously at other times. Therefore it is understood that the specific operation of the load buffer 11 described with reference to FIGS. 5A–5C is merely exemplary.

After processing is complete and the wafers have been returned to the load lock 35, the lid of load lock 35 elevates, the lift lower mechanism 41 lifts the wafers to the elevation of the first wafer exchange port 31, and the first loader mechanism 37 returns the wafers to the cassette 43 positioned on the wafer exchange port 31. As the first lid 39 of load lock 35 lowers, lift/lower mechanism 41 lowers, and the second lid 47 of the wafer carrier 43 lowers, sealing around the cassette 43a. Thereafter the second robot 15 transfers the wafer carrier 43 either to a storage shelf 25a,25b or to the second overhead load port. If the second robot 15 places the wafer carrier 43 on one of the storage shelves 25, the first robot 13 may then transfer the wafer carrier 43 either to the first load port 27 or to the first overhead load port. Thus a wafer carrier full of processed wafers travels backward through the load buffer 11 in the same manner as a wafer carrier of unprocessed wafers travels forward through the load buffer 11, only the direction of travel changes. Each robot elevates a wafer carrier between the respective load port or wafer exchange port and the overhead load ports or storage shelves. As used herein the term "elevate" refers to any y-axis movement and therefore includes both lifting and lowering.

In operation, at any given time wafer carriers may be traveling both forward and backward through the load buffer 11. Thus, a robot may transfer a first wafer carrier to the storage shelves or to the overhead load ports, and then immediately pick up a second wafer carrier for transfer to one of the load ports or to the wafer exchange ports.

Although with reference to the side elevational views of FIGS. 1, 4A–F and 5A–C only the first side of the load buffer 11 is shown and described (i.e., the first load port through the first wafer exchange port) it is understood that the configuration and operation of the second side of the load buffer 11 (i.e., the second load port through the second wafer exchange port) is identical to that disclosed.

The foregoing description discloses only the preferred embodiment of the invention, modification of the above disclosed apparatus and method which fall within the scope of the invention will be readily apparent to those of ordinary skill in the art. For instance, although only four storage locations 25a, 25b, 25c and 25d are shown, additional storage locations could be provided. Although each of the storage locations 25a, 25b, 25c and 25d is shown as being wide enough to hold only a single wafer carrier, the size of the storage locations may vary so as to hold a plurality of wafer carriers. As well, the specific apparatus employed as the first and second vertical transfer mechanism may vary, as may the specific location and coupling of components. Accordingly, while the present invention has been disclosed in connection with the preferred embodiments thereof, it should be understood that other embodiments may fall within the spirit and scope of the invention, as defined by the following claims.

What is claimed is:

1. An apparatus for buffering wafer carriers to be loaded to a wafer fabrication tool comprising:
   a first load port for receiving a wafer carrier to be stored;
   a first vertical transfer mechanism, operatively coupling said first load port, dedicated to transferring the wafer carrier to be stored between the first load port and a height greater than that of the wafer fabrication tool;
   at least one storage location located above the wafer fabrication tool operatively coupling said first vertical transfer mechanism for receiving the wafer carrier to be stored;
   a second vertical transfer mechanism operatively coupling said at least one storage location and extending downward from said at least one storage location, dedicated to transferring the wafer carrier between the at least one storage location and the wafer fabrication tool; and
   a first wafer exchange port, operatively coupling said second vertical transfer mechanism for receiving the wafer carrier.

2. The apparatus of claim 1 wherein the first load port is for receiving wafer carriers from a factory.

3. The apparatus of claim 1 wherein the first wafer exchange port is for receiving wafers to be loaded to the wafer fabrication tool.

4. The apparatus of claim 1 wherein the first vertical transfer mechanism is coupled to an overhead wafer carrier transport system.

5. The apparatus of claim 1 wherein the first vertical transfer mechanism comprises a first x-axis component and a first y-axis component and wherein the second vertical transfer mechanism comprises a second x-axis component and a second y-axis component.

6. The apparatus of claim 5 wherein the first x-axis component is moveably coupled to the first y-axis component and is configured so as to be able to access the first load port.

7. The apparatus of claim 6 wherein the first vertical transfer mechanism is configured so as to access the first load port from a position above the first load port.

8. The apparatus of claim 6 wherein the first vertical transfer mechanism is configured so as to access an overhead factory automation system.

9. The apparatus of claim 5 wherein the second x-axis component is moveably coupled to the second y-axis component and is configured so as to access the first wafer exchange port.

10. An automated local area semiconductor wafer fabrication system for automatically storing, loading and processing semiconductor wafers comprising:
   a semiconductor wafer fabrication tool comprising at least a first load lock;
   a transfer chamber operatively coupling said first load lock;
   at least one process chamber; and
   an apparatus for buffering wafers to be loaded to the wafer fabrication tool, said apparatus operatively coupled to the first load lock, comprising:

a first load port for receiving at least one wafer carrier to be stored;

a first vertical transfer mechanism, operatively coupling said first load port and extending upward from said first load port, dedicated to transferring the at least one wafer carrier between the first load port and a height greater than that of the wafer fabrication tool;

at least one storage location located above the wafer fabrication tool and operatively coupling said first vertical transfer mechanism for receiving the at least one wafer carrier;

a second vertical transfer mechanism operatively coupling said at least one storage location and extending downward from said at least one storage location, dedicated to transferring the at least one wafer carrier between the at least one storage location and the wafer fabrication tool; and a first wafer exchange port, operatively coupling said second vertical transfer mechanism and said first load lock.

11. The automated local area semiconductor wafer fabrication system of claim 10 wherein the load lock comprises a first lid which allows wafers to be loaded into the load lock from a position above the first load lock.

12. The automated local area semiconductor wafer fabrication system of claim 11 wherein the first lid comprises a wafer carrier engaging mechanism for causing a wafer carrier lid to elevate as the first lid elevates.

13. The automated local area semiconductor wafer fabrication system of claim 12 wherein the load lock further comprises a lift/lower mechanism for lowering wafers into the load lock.

14. The automated local area semiconductor wafer fabrication system of claim 13 further comprising a first loader mechanism for transferring wafers from the first wafer exchange port to a position above the load lock, for subsequent lowering into the load lock.

15. A factory automation system comprising a first automated local area semiconductor wafer fabrication system comprising:

a wafer fabrication tool comprising:
   at least a first load lock;
   a transfer chamber operatively coupling said first load lock; and
   at least one process chamber; and an apparatus for buffering wafer carriers to be loaded to the wafer fabrication tool, said apparatus operatively coupled to the first load lock, comprising:
   a first load port for receiving a wafer carrier to be stored;
   a first vertical transfer mechanism, operatively coupling said first load port and extending upward from said first load port, dedicated to transferring the wafer carrier to be stored between the first load port and a height greater than the height of the wafer fabrication tool;
   at least one storage location located above the wafer fabrication tool and operatively coupling said first vertical transfer mechanism for receiving the wafer carrier to be stored;
   a second vertical transfer mechanism operatively coupling said at least one storage location and extending downward from said at least one storage location, dedicated to transferring the wafer carrier between the at least one storage location and the wafer fabrication tool; and
   a first wafer exchange port, operatively coupling said second vertical transfer mechanism and said first load lock.

16. The factory automation system of claim 15 further comprising an overhead wafer carrier transport system operatively coupling said first automated local area semiconductor device wafer processing system to at least a first wafer fabrication tool, so as to automatically transport wafers between said first automated local area semiconductor device wafer processing system and said first wafer fabrication tool.

17. The apparatus of claim 15 wherein the first vertical transfer mechanism comprises a first x-y axis robot, the second vertical transfer mechanism comprises a second x-y axis robot and the at least a first storage location comprises a first shelf through which at least one wafer carrier can be transferred from the first vertical transfer mechanism to the second vertical transfer mechanism.

18. A method of providing a local area buffer of wafers for loading to a wafer fabrication tool, comprising:
   receiving a first wafer carrier at the wafer fabrication tool;
   placing the first wafer carrier in a first storage location above the wafer fabrication tool;
   retrieving a second wafer carrier from a second storage location above the wafer fabrication tool; and
   lowering the second wafer carrier to a tool load port of the wafer fabrication tool.

19. The method of claim 18 wherein the step of receiving the first wafer carrier at the wafer fabrication tool comprises receiving the first wafer carrier from an overhead wafer carrier transport system.

20. The method of claim 18 further comprising elevating the first wafer carrier to the first storage location via a first wafer handler, and wherein lowering the second wafer carrier comprises lowering the second wafer carrier via a second wafer handler.

21. The method of claim 18 wherein placing the first wafer carrier in a first storage location above the wafer fabrication tool comprises placing the first wafer carrier in a storage shelf above the wafer fabrication tool.

22. The method of claim 21 wherein placing the first wafer carrier in a first storage location above the wafer fabrication tool comprises transferring the first wafer carrier from a first load port to the storage shelf via a first robot, and lowering the second wafer carrier to the tool load port of the wafer fabrication tool comprises lowering the second wafer carrier from the storage shelf to the tool load port via a second robot.

23. The method of claim 18 further comprising:
   transferring at least one wafer stored in said second wafer carrier from the tool load port to a load lock of the wafer fabrication tool;
   transferring the at least one wafer from the load lock to a processing chamber within the wafer fabrication tool; and
   processing the at least one wafer within the processing chamber.

* * * * *